United States Patent
Weis et al.

(10) Patent No.: US 10,903,079 B2
(45) Date of Patent: Jan. 26, 2021

(54) METHOD FOR FORMING COMPLEMENTARY DOPED SEMICONDUCTOR REGIONS IN A SEMICONDUCTOR BODY

(71) Applicant: Infineon Technologies Dresden GmbH & Co. KG, Dresden (DE)

(72) Inventors: Rolf Weis, Dresden (DE); Thomas Gross, Sinzing (DE); Hermann Gruber, Woerth a. D. (DE); Franz Hirler, Isen (DE); Andreas Meiser, Sauerlach (DE); Markus Rochel, Radebeul (DE); Till Schloesser, Munich (DE); Detlef Weber, Ottendorf-Okrilla (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 34 days.

(21) Appl. No.: 16/351,256

(22) Filed: Mar. 12, 2019

(65) Prior Publication Data
US 2019/0287804 A1 Sep. 19, 2019

(30) Foreign Application Priority Data

Mar. 13, 2018 (DE) .................. 10 2018 105 741

(51) Int. Cl.
*H01L 21/225* (2006.01)
*H01L 29/66* (2006.01)
(Continued)

(52) U.S. Cl.
CPC .......... *H01L 21/2256* (2013.01); *H01L 21/22* (2013.01); *H01L 29/0634* (2013.01);
(Continued)

(58) Field of Classification Search
CPC ............. H01L 21/2256; H01L 21/22; H01L 2229/0634; H01L 2229/66901; H01L 2229/808
(Continued)

(56) References Cited

U.S. PATENT DOCUMENTS

| 5,726,094 A | 3/1998 | Schwalke et al. |
| 9,396,997 B2 * | 7/2016 | Hirler ............... H01L 29/42372 |

(Continued)

*Primary Examiner* — Andy Huynh
(74) *Attorney, Agent, or Firm* — Murphy, Bilak & Homiller, PLLC

(57) ABSTRACT

A method includes: forming first and second trenches in a semiconductor body; forming a first material layer on the semiconductor body in the first and second trenches such that a first residual trench remains in the first trench and a second residual trench remains in the second trench; removing the first material from the second trench; and forming a second material layer on the first material layer in the first residual trench and on the semiconductor body in the second trench. The first material layer includes dopants of a first doping type and the second material layer includes dopants of a second doping type. The method further includes diffusing dopants from the first material layer in the first trench into the semiconductor body to form a first doped region, and from the second material layer in the second trench into the semiconductor body to form a second doped region.

18 Claims, 10 Drawing Sheets

(51) Int. Cl.
*H01L 29/808* (2006.01)
*H01L 21/22* (2006.01)
*H01L 29/06* (2006.01)
*H01L 29/417* (2006.01)
*H01L 29/45* (2006.01)

(52) U.S. Cl.
CPC ...... *H01L 29/66901* (2013.01); *H01L 29/808* (2013.01); *H01L 29/0653* (2013.01); *H01L 29/0696* (2013.01); *H01L 29/41766* (2013.01); *H01L 29/456* (2013.01)

(58) Field of Classification Search
USPC .......................................................... 257/256
See application file for complete search history.

(56) References Cited

U.S. PATENT DOCUMENTS

| | | | |
|---|---|---|---|
| 2012/0146130 A1* | 6/2012 | Hirler | H01L 29/4175 257/329 |
| 2013/0149822 A1* | 6/2013 | Lee | H01L 29/66712 438/212 |
| 2016/0190137 A1 | 6/2016 | Tsai et al. | |
| 2017/0033213 A1* | 2/2017 | Hsu | H01L 29/66734 |

* cited by examiner

US 10,903,079 B2

METHOD FOR FORMING COMPLEMENTARY DOPED SEMICONDUCTOR REGIONS IN A SEMICONDUCTOR BODY

TECHNICAL FIELD

This disclosure in general relates to a method for forming complementary doped semiconductor regions in a semiconductor body. In particular, the disclosure relates to a method for forming complementary doped semiconductor regions adjacent to trenches.

BACKGROUND

Forming a doped semiconductor region in a semiconductor body may include forming a trench, filling the trench with a filling material including dopants, and diffusing the dopants from the filling material into the semiconductor body. Different types of filling materials are available, such as BSG (Borosilicate Glass), or PSG (Phosphosilicate Glass) or ASG (Arsenic doped Silicate Glass). BSG includes boron (B) as a dopant, PSG includes phosphorous (P) as a dopant and ASG includes arsenic (As) as dopant. In silicon, for example, boron acts as a p-type dopant and phosphorous and arsenic act as an n-type dopants. For forming complementary doped semiconductor regions, the method steps mentioned above may be performed twice, a first time, for forming a doped semiconductor region of a first doping type (n or p), and a second time for forming a doped semiconductor region of a second doping type (p or n) complementary to the first doping type.

SUMMARY

There is a need for a more efficient method for forming complementary doped semiconductor regions in a semiconductor body.

One example relates to a method for forming doped regions in a semiconductor body. The method includes forming a first trench and a second trench in the semiconductor body, forming a first material layer on the semiconductor body in the first trench and the second trench such that a first residual trench remains in the first trench and a second residual trench remains in the second trench, removing the first material from the second trench, and forming a second material layer on the first material layer in the first residual trench and on the semiconductor body in the second trench. The first material layer includes dopants of a first doping type and the second material layer includes dopants of a second doping type, complementary to the first doping type. The method further includes diffusing dopants from the first material layer in the first trench into the semiconductor body to form a first doped region and from the second material layer in the second trench into the semiconductor body to form a second doped region.

Another example relates to a semiconductor arrangement. The semiconductor arrangement includes a semiconductor body, at least one first trench formed in the semiconductor body, a first material layer on the semiconductor body in the first trench and a second material layer on the first material layer in the first trench. The first material layer comprises dopant atoms of a first doping type and the second material layer comprises dopant atoms of a second doping type complementary to the first doping type. The semiconductor arrangement further includes a doped region of the first doping type adjoining the at least one first trench in the semiconductor body. Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

Figure 1A:
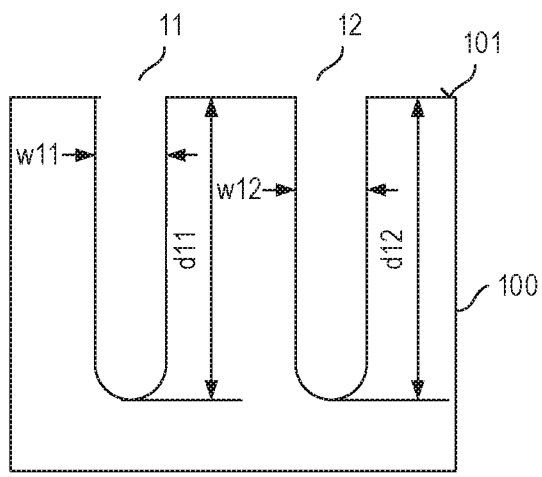
FIGS. 1A-1E illustrate one example of a method for forming complementary doped semiconductor regions in a semiconductor body.

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

FIGS. 1A-1E illustrate one example of a method for forming complementary doped semiconductor regions 31, 32 in a semiconductor body 100. Each of FIGS. 1A-1E shows a vertical cross-sectional view of the semiconductor body 100 during or after individual method steps of the method. "Vertical cross-sectional views" are views in section planes perpendicular to a first surface 101 of the semiconductor body 100. According to one example, the semiconductor body 100 is comprised of a monocrystalline semiconductor material. Examples of the semiconductor material include, but are not restricted to, silicon (Si), silicon carbide (SiC), gallium nitride (GaN), gallium arsenide (GaAs), or the like.

FIGS. 1A-1E only show one section of the semiconductor body 100, namely a section in which the complementary doped semiconductor regions are produced. Just for the purpose of illustration, these semiconductor regions are drawn to be close to each other. This, however, is only for the ease of illustration. Each of these semiconductor regions can be produced at any position in the semiconductor body 100. Further, FIGS. 1A-1E illustrate forming one semiconductor region 31 of a first doping type and one semiconductor region 32 of a second doping type complementary to the first doping type. This, however, is only an example. Any plurality of semiconductor regions of the first doping type and any plurality of semiconductor regions of the second doping type can be produced by this method. Further, the method explained in the following can be applied to a semiconductor wafer that includes a plurality of semiconductor bodies, wherein this semiconductor wafer can be separated after the method (and optional further method steps) to obtain a plurality of semiconductor bodies.

Referring to FIG. 1A, the method includes forming a first trench 11 and a second trench 12 in the first semiconductor body 100. Referring to FIG. 1A, forming the first trench 11 and the second trench 12 includes forming these trenches 11, 12 in the first surface 101 of the semiconductor body 100 and such theses trenches extend in the vertical direction of the semiconductor body 100. The "vertical direction" is a direction perpendicular to the first surface 101. Each of the first and second trenches includes sidewalls and a bottom, wherein the bottom terminates the respective trench 11, 12 in the vertical direction and the sidewalls extend between the first surface 101 and the bottom. Just for the purpose of illustration, the sidewalls are drawn to be perpendicular to the first surface 101 in the example shown in FIG. 1A, This, however, is only an example. According to another example, the sidewalls are inclined relative to the first surface 101 so that the trenches have a trapezoidal cross section.

Each of the first trench 11 and the second trench 12 have a width w11, w12 and a depth d11, d12. The width w11, w12 is the smallest dimension of the respective trench 11, 12 in a horizontal plane, which is a plane parallel to the first surface 101. The depth d11, d12 is the dimension of the respective trench 11, 12 in the vertical direction of the semiconductor body 100, which is the direction perpendicular to the first surface 101. According to one example, the width w11 of the first trench 11 essentially equals the width w12 of the second trench 12, and the depth d11 of the first trench 11 essentially equals the depth d12 of the second trench 12 (w11=w12 and d11=d12). This, however, is only an example. According to another example, the widths w11, w12 and/or the depths d11, d12 of the trenches 11, 12 are different (w11 w12 and/or d11 d12).

According to one example, the first trench 11 and the second trench 12 are produced such that their width w11, w12 is between 500 nanometers (nm) (=0.5 micrometers) and 5 micrometers (μm), and that their depth d11 is between 10 micrometers and 150 micrometers, in particular between 20 Micrometers and 70 Micrometers.

Figure 1B:
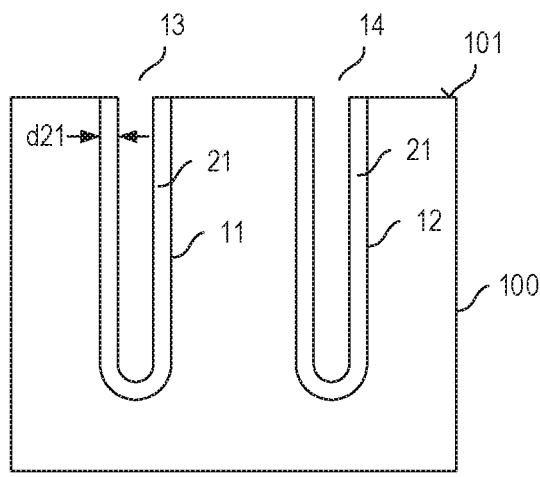

Referring to FIG. 1B, the method further includes forming a first layer 21 on the semiconductor body 100 in the first trench 11 and the second trench 12 such that a first residual trench 13 remains in the first trench 11 and a second residual trench 14 remains in the second trench 12. Forming the first layer 21 such that the first and second residual trenches 13, 14 remain may include forming the first layer 21 with a thickness d21 such that this thickness d21 is less than 50% of each of the first and second width w11, w12, that is, d21<0.5·w11 and d21<0.5·w12. According to one example, the thickness d21 of the first layer 21 is selected from between 1% and 40% of the widths w11, w12. According to one example, the thickness d21 of the first layer 21 is selected from between 50 nanometers (nm) and 800 nanometers.

The first layer 21 includes dopants of a first doping type. According to one example, dopants of the first doping type are n-type dopants. According to one example, the first layer 21 is a dielectric layer such as a dopant containing silicate glass layer. Examples of an n-type dopants including silicate glass layer include a phosphosilicate glass (PSG) layer, an arsenic doped silicate glass (ASG) layer, or the like. P-type dopants including a silicate glass layer of borosilicate glass (BSG) layer may be used, for example. Forming the first layer 21 may include a deposition process such as, for example, a CVD (Chemical Vapor Deposition) process.

Figure 1C:
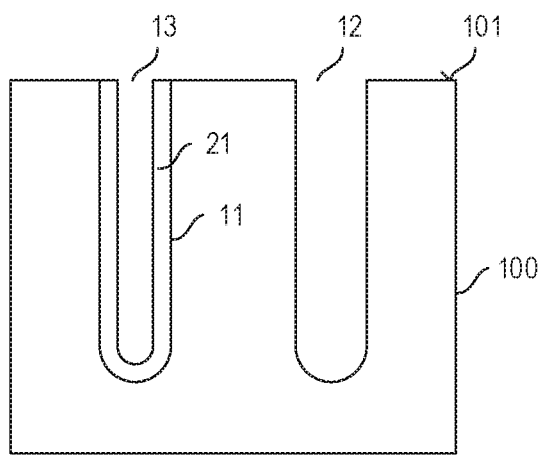
Figure 1D:
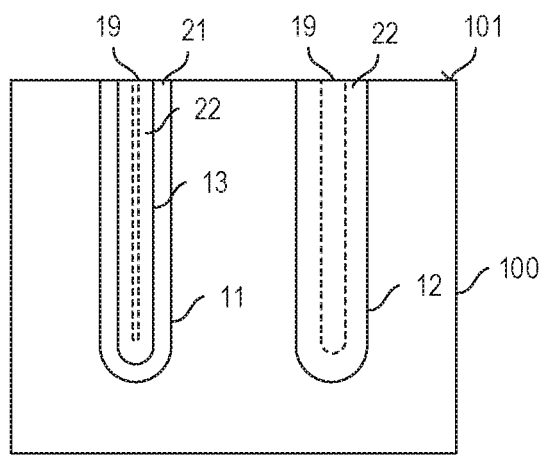

Referring to FIGS. 1C and 1D, the method further includes removing the first layer 21 from the second trench 12 (see FIG. 1C), and forming a second layer 22 on the semiconductor body 100 in the second trench 12 and on the first layer 21 in the first residual trench 13. This second layer 22 includes dopants of a second doping type complementary to the first doping type. According to one example, the dopants of the second doping type are p-type dopants. The second layer 22 is a silicate glass layer, for example. One example of a p-type dopants including silicate glass layer is a borosilicate glass (BSG) layer. Examples of an n-type dopants including silicate glass layer include a phosphosilicate glass (PSG) layer, or an arsenic doped silicate glass (ASG) layer. Forming this second layer 22 may include a deposition process such as, for example, a CVD process.

Referring to FIG. 1D, the second layer 22 may be produced such that it completely fills the first residual trench 13 and completely fills the second trench 12. This, however, is only an example. According to another example the second layer 22 may be produced such that it covers the semiconductor body 100 in the second trench 12 and the first layer 21 in the first residual trench 13, but completely fills neither of the second trench 12 and the first residual trench 13. Residual trenches 19 remaining in this case are illustrated in dashed lines in FIG. 1D. According to another example (not shown), the second layer 22 is produced such that it completely fills the first residual trench 13 but leaves a residual trench in the second trench 12.

Figure 1E:
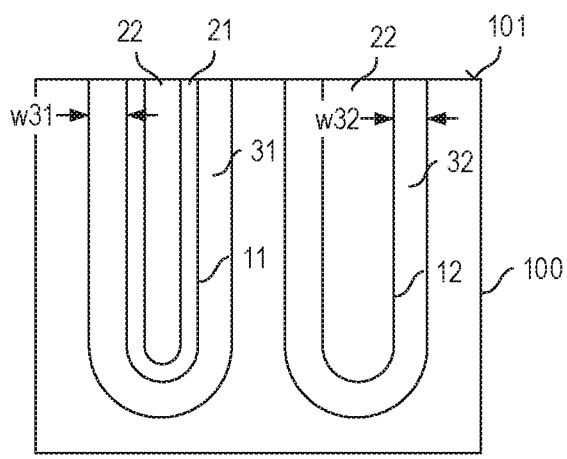

Referring to FIG. 1E, the method further includes diffusing first type dopants from the first layer 21 in the first trench 11 into the semiconductor body 100 to form the first semiconductor region 31, and diffusing second type dopants from the second layer 22 in the second trench 12 into the semiconductor body 100 to form the second semiconductor region 32. The first semiconductor region 31 adjoins the first trench 11 and the second semiconductor region 32 adjoins the second trench 12. Diffusing the first type dopants and the second type dopants from the first layer 21 and the second layer 22, respectively, into the semiconductor body 100 includes a temperature process, wherein a temperature in this temperature process is high enough and a duration of this temperature process is long that the dopants, from the first semiconductor layer 21 in the first trench 11 and the second semiconductor layer 22 in the second trench 12, diffuse into the semiconductor body 100.

According to one example, a temperature in this temperature process is selected from a range of between 600° C. and 1200° C., and a duration is selected from between 1 minute and 25 hours. According to one example, each temperature process includes several sub-processes with different temperatures selected from the temperature range explained above. Further, the temperature process can be a continuous process in which the temperature is continuously kept within the temperature range captioned above for the desired duration of the temperature process. According to another example, the temperature process includes two or more sub-processes, wherein the duration of the temperature process is given by a sum of durations of the sub-processes, wherein in each of the sub-processes the temperature is within the temperature range captioned above, and wherein the temperature decreases to below 600° C. between two sub-processes. How far the first and second semiconductor regions 31, 32 extend from the respective trench 11, 12 into the semiconductor body 100 is dependent on the duration and the temperature of the temperature process. According to one example, these parameters of the temperature process are selected such that a width w31, w32 of each of the first and second semiconductor region 31, 32 is between 100 nanometers (nm) and 2 micrometers (μm). The "width" w31, w32 is the dimension of the respective semiconductor region 31, 32 in a direction perpendicular to the first and second trench 11, 12.

In the first trench 11, the first layer 21 is arranged between the second layer 22 and the semiconductor body 100. In the diffusion process, the first layer 21 in the first trench 11 acts as a diffusion barrier for the second type dopants in the second layer 22 arranged in the first trench 11. Thus, from the first trench 11, only first type dopants from the first layer 21 diffuse into the semiconductor body 100. In the second trench 12, there is no such diffusion barrier so that second type dopants from the second layer 22 diffuse into the semiconductor body 100. In this way, complementary doped first and second semiconductor regions 31, 32 are formed.

According to one example, a thin oxide layer (not shown) is formed on the semiconductor body 100 in the first trench 11 before the first layer 21 is formed and/or in the second trench 12 before the second layer 22 is formed. Forming this oxide layer may include a thermal oxidation process. A thickness of this oxide layer is less than 5 nanometers, for example. Such oxide layer reduces a diffusion of dopant atoms from the first layer 21 or second layer 22 adjoining the oxide layer into the semiconductor body 100, but does not prevent such diffusion.

The first and second layers 21, 22 may remain in the first and second trenches 11, 12 after the process illustrated in FIGS. 1A-1E so that these layers 21, 22 may still be present in a finished semiconductor device that includes the first and second regions 31, 32. (One example of such semiconductor device is explained in further detail herein below.) In this case, contacts (not shown in FIG. 1E) may be formed on the first surface 101 in order to electrically contact the first and second semiconductor region 31, 32.

Figure 2A:
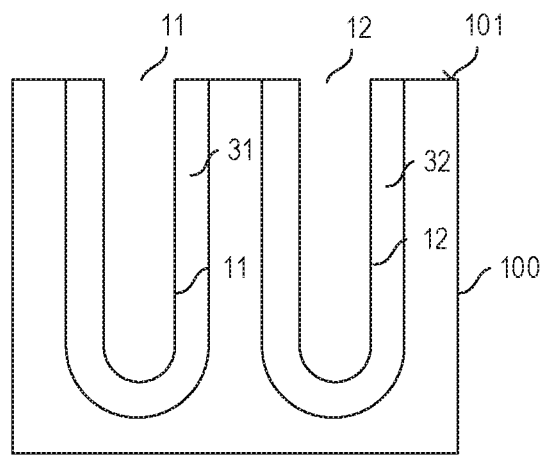
FIGS. 2A-2B illustrate optional further method steps in a method of the type shown in FIGS. 1A-1E.
Figure 2B:
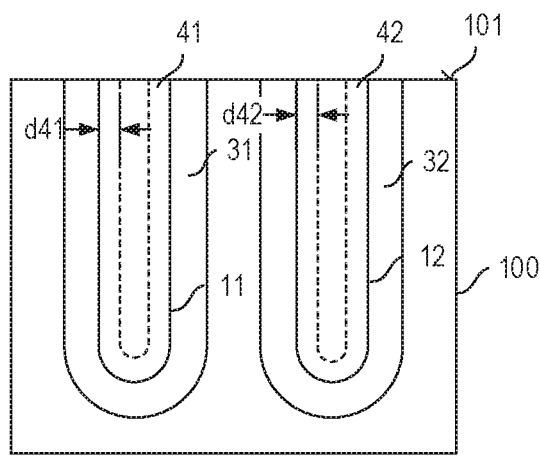

According to another example, the first and second layers 21, 22 are replaced by electrically conducting layers 41, 42. This is illustrated in FIGS. 2A-2B. FIG. 2A shows a vertical cross sectional view of the semiconductor body 100 after removing the first and second layers 21, 22 from the first and second trenches 11, 12. FIG. 2B shows a vertical cross sectional view of the semiconductor body 100 after electrically conducting layers 41, 42 have been formed in the first and second trenches. In the example illustrated in FIG. 2B, each of these electrically conducting layers 41, 42 completely fills the respective trench, that is, conducting layer 41 fills the first trench 11 and conducting layer 42 fills the second trench 12. This, however, is only an example. According to another example, which is illustrated in dashed lines in FIG. 2B, the conducting layers 41, 42 are formed such that they cover the first and second semiconductor region 31, 32 in the first and second trenches 11, 12, but leave a residual trench. The latter is obtained by forming the first conducting layer 41 such that its thickness d41 is less than 50% of the width w11 of the first trench 11, and by forming the second conducting layer 42 such that its thickness d42 is less than 50% of the width w12 of the second trench 12.

In the method illustrated in FIGS. 2A-2B, the first and second layers 21, 22 are completely removed from the first and second trenches 11, 12. This, however, is only an example. According to another example illustrated in FIGS. 3A-3B these first and second layers 21, 22 are removed from upper sections of the first and second trenches 11, 12, only. "Upper sections" are sections extending from the first surface 101 in the vertical direction of the first semiconductor body 100, but not as deep as the first and second trenches 11, 12. Trenches resulting from removing the first and second layers 21, 22 from upper sections of the first and second trench 11, 12 are labelled with 15 and 16 in FIG. 3A, which shows the semiconductor body 100 after removing the first and second layers 21, 22 from upper sections of the trenches 11, 12. Referring to FIG. 3B, the conducting layers 41, 42 are formed in these trenches 15, 16. Like in the example explained with reference to FIGS. 2A and 2B, these conducting layers 41, 42 may completely fill the trenches 15, 16, or may leave residual trenches.

Figure 3A:
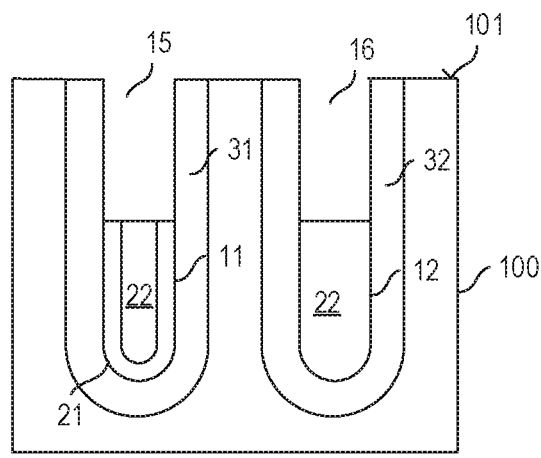
FIGS. 3A-3B illustrate a modification of the method steps illustrated in FIGS. 2A-2B.
Figure 3B:
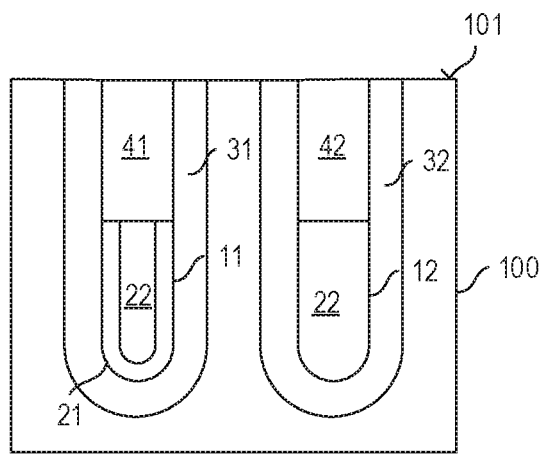

In the example illustrated in FIGS. 3A-3B, a respective contact plug 41, 42 is formed in each of the first and second trenches 11, 12 so that both the first and second doped region 31, 32 are connected to a respective contact plug 41, 42. This, however, is only an example. According to another example, a contact plug is produced in only one of the first and second trenches 11, 12.

Figure 4A:
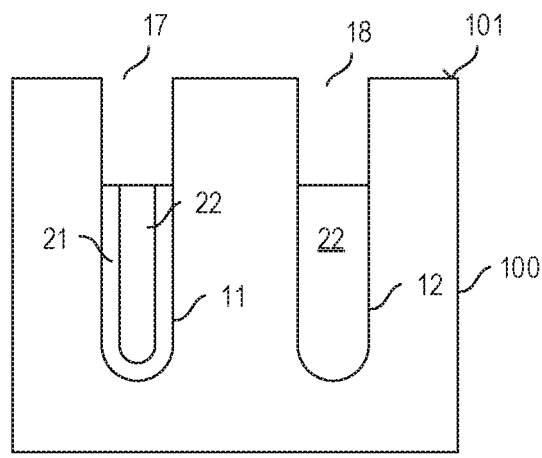
FIGS. 4A-4B illustrate a modification of the method illustrated in FIGS. 1A-1E.
Figure 4B:
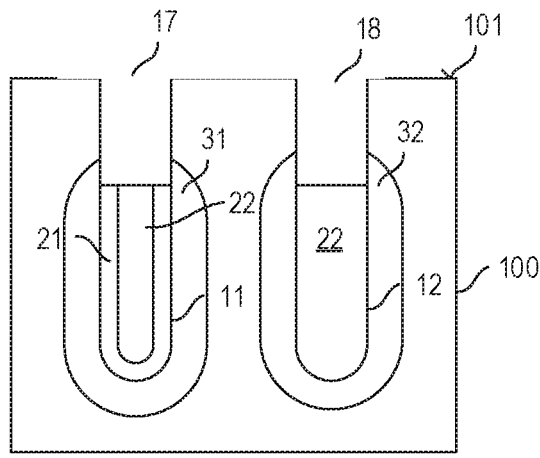

FIGS. 4A-4B illustrate a further modification of the method shown in FIGS. 1A-1B. In this method, the first and second layers 21, 22 are removed from upper sections of the first and second trenches 11, 12 before the diffusion process. This is illustrated in FIG. 4A. FIG. 4B shows the semiconductor body 100 after the diffusion process. In this example, the first and second semiconductor region 31, 32 do not adjoin the surface 101, but are spaced apart from the surface 101 in the vertical direction of the semiconductor body 100. A distance between the first and second semiconductor region 31, 32 and the first surface 101 is essentially given by a depth of trenches 17, 18 formed by removing the first and second layers 21, 22 from the upper sections of the first and second trenches 11, 12. According to one example, a depth of these trenches 17, 81 is selected such that an aspect ratio is smaller than 5:1, in particular, smaller than 2:1. The "aspect ratio" is the ratio between a depth and a width of the trenches 17, 81 so that an aspect ratio of 2:1, for example, means that the depth is 2 times the width.

Figure 5:
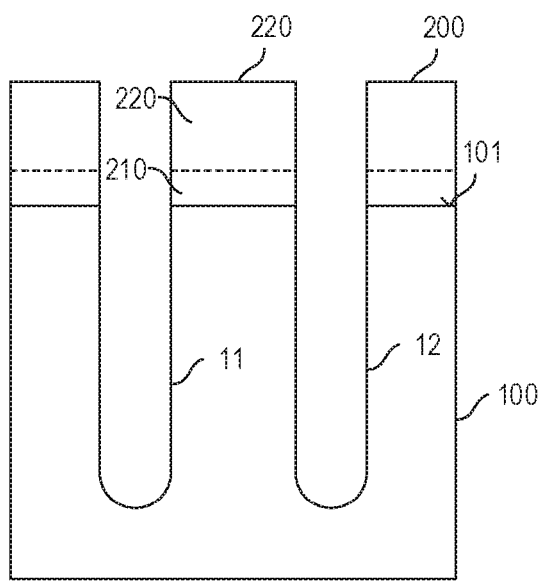
FIG. 5 illustrates one example of method for forming a first trench and a second trench in the semiconductor body in a method of the type shown in FIGS. 1A-1E.

Forming the first and second trenches 11, 12 illustrated in FIG. 1A may include an etching process using an etch mask 200 formed on top of the first surface 101 of the semiconductor body 100. FIG. 5 shows a vertical cross-sectional view of the semiconductor body 100 and of the etch mask 200 on top of the semiconductor body 100 after the etching process. According to one example, the etching process includes an anisotropic etching process. According to one example illustrated in dashed lines in FIG. 5, the etch mask 200 includes two mask layers, a first mask layer 210 formed on the first surface 101 and a second mask layer 220 formed on the first mask layer 210. According to one example, the first mask layer 210 is a nitride layer, a carbon layer, or a photoresist layer, and the second mask layer 220 is an oxide layer, such as an oxide hard mask layer. In each case, the first mask layer 210 and the second mask layer 220 are such that the second mask layer 220 can be removed selectively relative to the first mask layer 210 by an etching process, for example.

Figure 6:
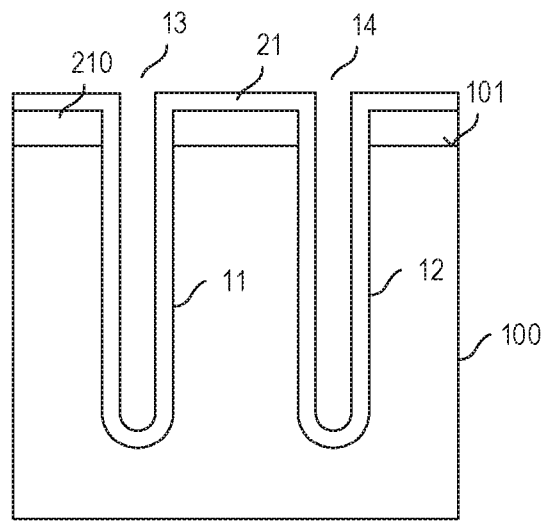
FIG. 6 illustrates one example of a method for forming a first layer in a method of the type shown in FIGS. 1A-1E.
Figure 7A:
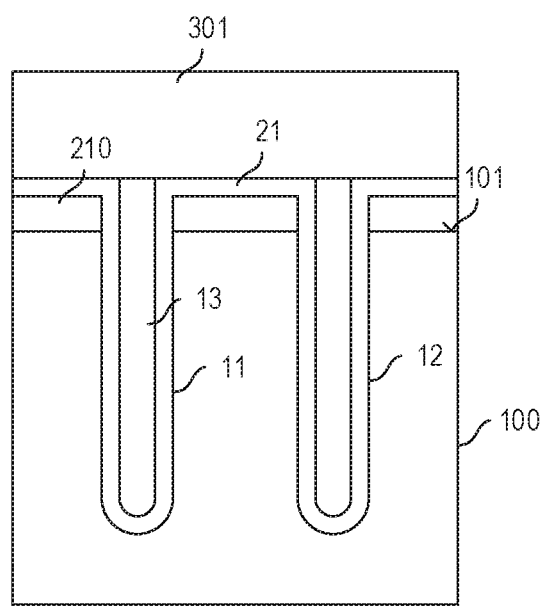
FIGS. 7A-7C illustrate one example of a method for removing the first layer from a second trench in a method of the type shown in FIGS. 1A-1E.
Figure 7B:
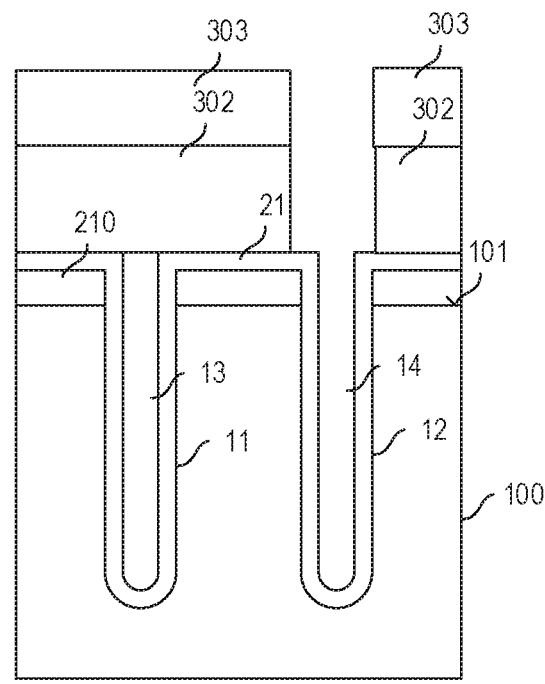
Figure 8:
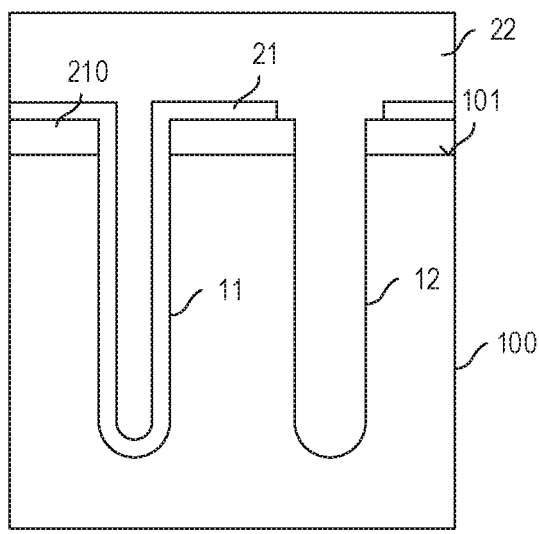
FIG. 8 illustrates one example of a method for forming a second layer in a method of the type shown in FIGS. 1A-1E.

According to one example, the second mask layer 220 is removed after the process of forming the first and second trenches 11, 12, while the first mask layer 210 remains in place for at least some of the subsequent processing sequences. Examples of such subsequent processing sequences are explained with reference to FIGS. 6, 7A-7B and 8, wherein FIG. 6 shows one example of a process sequence for forming the first layer 21, FIGS. 7A-7B show one example of a process sequence for removing the first layer 21 from the second trench 12, and FIG. 8 shows one example of a process sequence for forming the second layer 22. In these examples, the first mask layer 210 is in place on top of the semiconductor body 100.

In the example shown in FIG. 6, forming the first layer 21 on the semiconductor body 100 in the first trench 11 and the second trench 12 includes forming the first layer 21 all over the arrangement with the semiconductor body 100 and the first mask layer 210, so that the first layer 21 is formed on the semiconductor body 100 in the first and second trenches 11, 12 and on surfaces of the first mask layer 210. In this example, the first layer 210 completely covers the semiconductor body 100 inside the first and second trench 11, 12 and completely covers the first mask layer 210. Forming the first layer 21 may include a deposition process such as, for example, a CVD process.

Figure 7C:
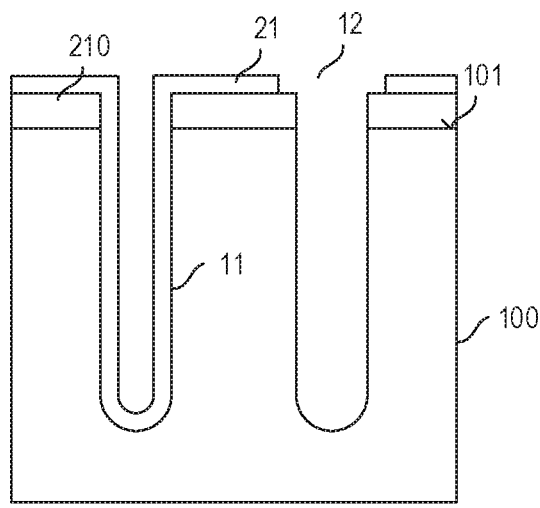

FIGS. 7A-7C illustrate one example of a method for removing the first layer 21 from the second trench 12. The process sequence illustrated in FIGS. 7A-7C is based on the semiconductor structure shown in FIG. 6 that includes the semiconductor body 100, the first mask layer 210 on top of the semiconductor body 100 and the first layer 21 formed on surfaces of the semiconductor body 100 and the first mask layer 210. Referring to FIG. 7B, the method includes forming an etch mask 302 such that the etch mask 300 at least covers the first residual trench 13 (without filling the first residual trench 13) and does not cover the second residual trench 14. The etch mask 300 in this way protects the first layer 21 in the first trench 11 from being removed, while it uncovers the first layer 21 in the second trench 12 (and the second residual trench 14).

Referring to FIGS. 7A and 7B, forming the etch mask 302 may include forming a mask layer 301 such that it covers both the first residual trench 13 and the second residual trench 14 (see FIG. 7A) and patterning the mask layer 301 using a further mask 303 formed on top of the mask layer 301 such that mask layer 301 has an opening above the second residual trench 14. The mask layer 301 is a carbon layer, for example, and the further mask 303 includes a photoresist, for example. Forming the mask layer 301 may include a PECVD (Plasma-Enhanced Chemical Vapor Deposition) process. This type of process is a non-conformal deposition process such that the material forming the mask layer 301 is deposited faster on horizontal surfaces of the first layer 21 outside the residual trenches 13, 14 than on vertical surfaces inside the residual trenches 13, 14. This has the effect that the mask layer 301 closes the residual trenches 13, 14, but does not fill the residual trenches 13, 14 so that voids remain below the mask layer 301.

Referring to FIG. 7C, those sections of the second layer 21 that are not covered by the etch mask 300 are removed in an etching process. FIG. 7B shows the semiconductor arrangement after the etching process and after removing the etch mask 300. According to one example, the etching process is an isotropic etching process. Hydrofluoric (HF) acid may be used as an etchant in this process, wherein, optionally, a buffering agent, such as ammonium fluoride ($NH_4F$), may be added to buffer (slow down) the etching process. When forming the mask layer 301 shown in FIG. 7A, some material may be deposited on the first layer 21 inside the first and second residual trenches 13, 14. According to one example, before removing the first layer 21 from surfaces of the semiconductor body 100 in the second residual trench 14, another isotropic etching process takes place that "cleans" the surface of the first layer 21 from mask layer material (e.g., carbon).

FIG. 8 illustrates the semiconductor arrangement shown in FIG. 7B after forming the second layer 22. In this example, forming the second layer 22 includes forming the second layer 22 such that it completely fills the second trench 12 and the first residual trench 13 and covers those sections of the first mask layer 210 that are uncovered after the etching process illustrated in FIGS. 7A-7. Further, in this example, the second layer 22 covers sections of the first layer 21 remaining on the first mask layer 210 after the etching process.

Referring to FIG. 1E and the corresponding description, the method includes diffusing first type dopants and second type dopants from the first layer 21 and the second layer 22, respectively, into the semiconductor body 100. According to one example, the method includes forming a diffusion barrier on the first and second layers 21, 22 in the first and second trenches 11, 12 before this diffusion process. The diffusion barrier prevents dopants from diffusing out of the first and second layers 11, 12 into the atmosphere surrounding the semiconductor body 100 and, therefore, prevent these dopants from contaminating the processing atmosphere. One example of a method for forming such diffusion barriers is illustrated in FIGS. 9A-9C.

Figure 9A:
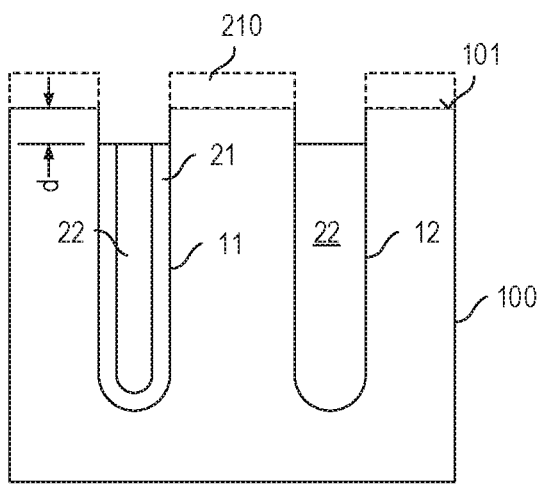
FIGS. 9A-9C illustrate optional further method steps in a method of the type shown in FIGS. 1A-1E.

Referring to FIG. 9A, the method includes removing the first and second layers 21, 22 from upper sections of the first and second trenches 11, 12. Based on a structure as shown in FIG. 8, for example, this removing may include an etching process which stops when the first and second layers 21, 22 have been etched back in the first and second trenches 11, 12 to a predefined depth. According to one example, the first and second layers 21, 22 are etched back such that a distance d between these layers 21, 22 and the first surface 101 of the semiconductor body is between 100 nanometers (nm) and 500 nanometers (nm). According to one example (illustrated in dashed lines in FIG. 9A) the first mask layer 210 remains in place when etching back the first and second layers 21, 22.

Figure 9B:
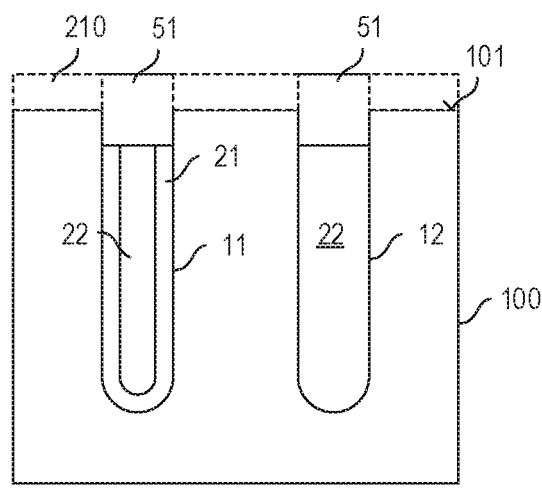
Figure 9C:
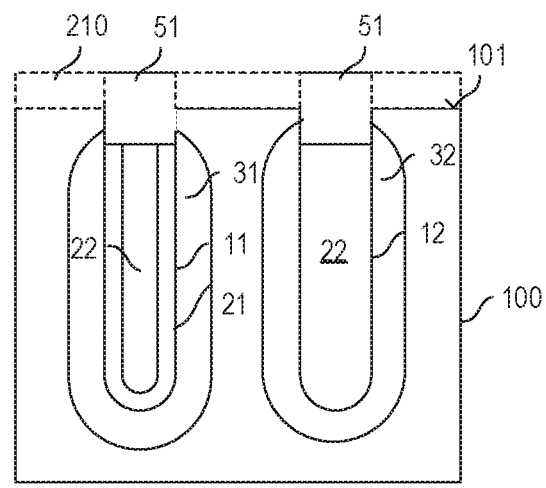

FIG. 9B shows the semiconductor body 100 after forming the diffusion barriers 51. Referring to FIG. 9B, forming the diffusion barriers 51 may include completely filling trenches formed by etching back the first and second layers 21, 22 with a diffusion barrier material. According to one example, the diffusion barrier material includes at least one of TEOS (Tetraethoxysilane) and HDP (High Density Plasma) oxide. Forming the diffusion barriers 51 may include depositing a diffusion barrier layer such it completely fills the trenches formed by etching back the first and second layers 21, 22 and covers the surface of the semiconductor body 100 or the first mask layer 210, and planarizing the diffusion barrier layer such that the diffusion barrier layer only remains in these trenches, thereby forming the diffusion barriers 51. FIG. 9C shows the arrangement illustrated in FIG. 9B after the diffusion process, that is, after forming the first and second regions 31, 32.

FIGS. 10A-10D illustrate one example of a method for removing the first and second layers 21, 22 from the first and second trench 11, 12 and forming an electrically conducting layer in these trenches 11, 12. Each of FIGS. 10A-10D shows a vertical cross-sectional view of the semiconductor body 100 during or after different process steps of the method.

Figure 10A:
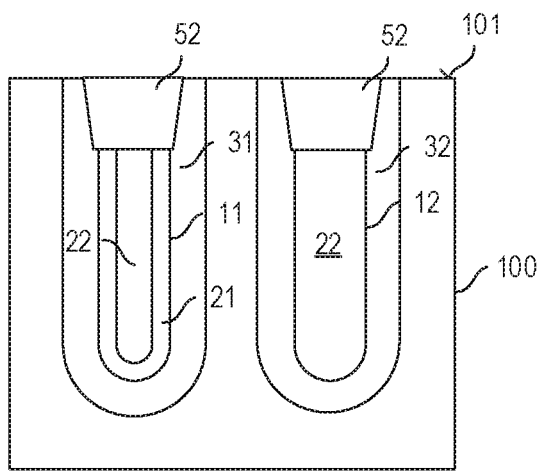
FIGS. 10A-10D illustrate one example of a method illustrated in FIGS. 2A-2B in greater detail.

Referring to FIG. 10A, the method includes forming oxide plugs 52 that optionally extend from the first surface 101 into the semiconductor body 100. These oxide plugs 52 are formed such that they completely cover the first and second layers 21, 22 in the first and second trenches 11, 12. These oxide plugs 52 can be identical with the diffusion barriers 51 shown in FIGS. 9B and 9C or can be formed based on these diffusion barriers 51 by planarizing these diffusion barriers 51 down to the surface 101 of the semiconductor body 100. According to another example, the diffusion barrier 51 is removed after the diffusion process illustrated in FIG. 9C and a "new" oxide plug 52 is formed in the trench resulting from removing the diffusion barrier 51. Forming such oxide plug 52 may include oxidizing surfaces of the semiconductor body 100 in the trench resulting from removing the diffusion barrier 51 so that a residual trench remains, and filling the residual trench with an oxide such as an HDP oxide. Using the same process, STIs (Shallow Trench Isolations), can be formed in other sections of the semiconductor body 100. Such STIs, however, are not shown in the drawings. Referring to FIG. 10A, the oxide plugs 52, in horizontal directions of the semiconductor body 100, may extend into the first and second semiconductor regions 31, 32.

Figure 10B:
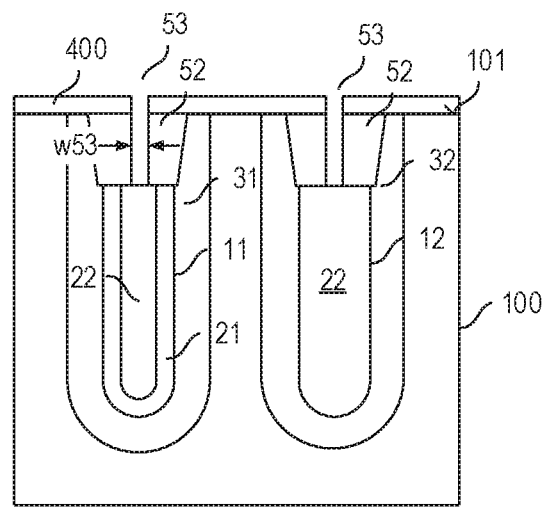

Referring to FIG. 10B, the method further includes forming trenches 53 in the oxide plugs 52 such that the trenches 53 completely extend through the oxide plugs 52 down to the first and second layers 21, 22. Forming these trenches 53 may include an etching process using a patterned etch mask 400 formed on top of the first surface 101 of the semiconductor body 100. According to one example, the trenches 53 in the oxide plugs 52 are formed such that these trenches 53 are narrower than the first and second trenches 11, 12, that is, a width w53 of these trenches 53 is lower than the widths w11, w12 of the first and second trenches (w53<w11 and w53<w12). According to one example, the width w53 of the trenches 53 in the oxide plugs 52 is selected from between 100 nanometers (nm) and 500 nanometers (nm). The oxide plugs 52 with the trenches 53 form oxide collars 52 in the upper sections of the first and second trenches 11, 12.

Figure 10C:
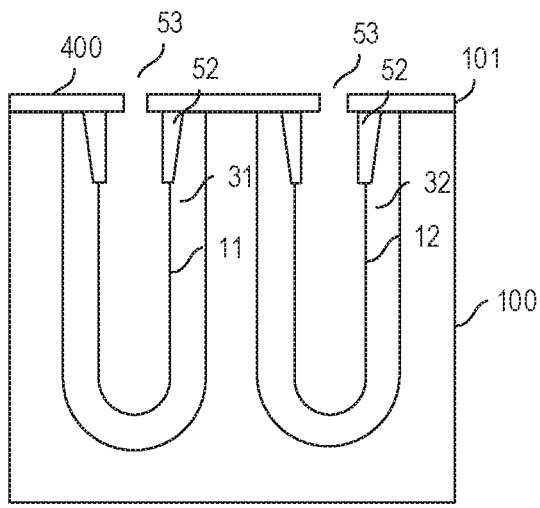

Referring to FIG. 10C, the method further includes removing the first and second layers 21, 22 from the first and the second trenches 11, 12. Removing the first and second layers 21, 22 may include a wet etching process using a wet etchant. According to one example, the wet etchant is selected such that it etches the first and second layers 21, 22 faster than the oxide collar 52. Thus, the etching process causes the trenches 53 in the oxide plugs 52 to widen during the etching process. However, at the end of etching process, that is, when the first and second layers 21, 22 have been completely removed from the first and second trenches 11, 12, the oxide collars 52 (with widened trenches 53) are still in place. The wet etchant, for example, contains hydrofluoric acid (HF) and/or sulfuric acid ($H_2SO_4$). Such wet etchant etches the dopants containing (i.e., doped) first and second layers 21, 22 at least twenty times faster than the non-doped oxide collar 52. The etch rate when etching the oxide collar 51 is, for example, 4 nanometers per minute (nm/min), while the etch rate when etching the first and second layers 21, 22 is 100 nanometers per minute, or higher. According to one example, the wet etchant also etches the etch mask 400. The etch rate of the etch mask, however, is even lower than the etch rate of the oxide collar 52. According to one example, the etch mask 400 is a nitride mask. The wet etchant explained herein before etches such nitride mask at an etch rate of 0.6 nanometers per minute. Referring to the above, the second layer 22 can be produced such that a residual trench remains in each former first and second trench 11, 12. This increases the surface at which the etchant can get in contact with the second layer 22 and, therefore, reduces the duration of the etching process.

Figure 10D:
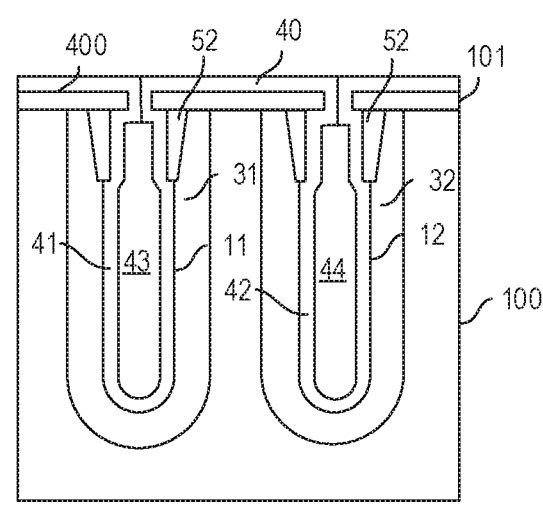

Referring to FIG. 10D, the method further includes depositing an electrically conducting layer such that the electrically conducting layer 40 at least covers surfaces of semiconductor body 100 inside the trenches 11, 12 in order to form contact electrodes 41, 42 in these trenches. According to one example, the conducting layer 40 is formed such that it closes an opening formed in the mask layer 400 and covers surfaces of the semiconductor body 100 in the first and second trenches 11, 12, but leaves voids 43, 44 inside the first and second trenches 11, 12.

Figure 11:
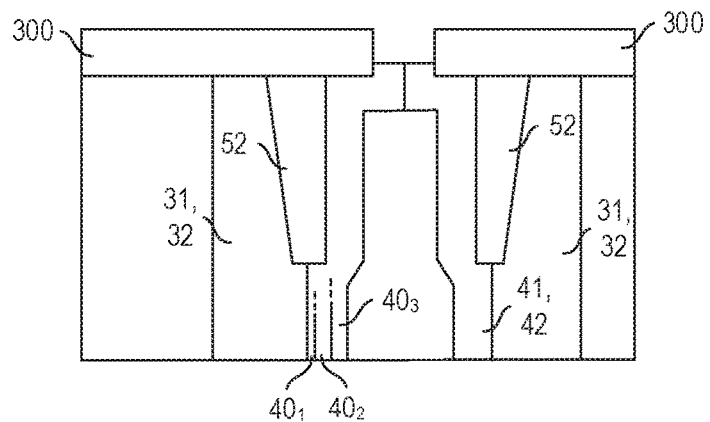
FIG. 11 shows an enlarged detail of the semiconductor structure shown in FIG. 10D.

According to one example, the electrically conducting layer 40 includes two or more sublayers. This is illustrated in FIG. 11 which shows an enlarged view of an upper trench section of one of the first and second trenches 11, 12. In the example illustrated in FIG. 11, the electrical conducting layer 40 includes three sublayers, a first layer $40_1$ that is formed directly on the semiconductor body 100 in the trenches 11, 12, a second layer $40_2$ formed on the first layer $40_1$, and a third layer $40_3$ formed on the second layer $40_2$. According to one example, the first layer $40_1$ is a titanium layer (Ti), the second layer $40_2$ is a titanium nitride (TiN) layer, and the third layer $40_3$ is a tungsten (W) layer. Each of these layers $40_1$, $40_2$, $40_3$ can be formed by a deposition process. According to one example, a silicide layer is formed based on the first sublayer $40_1$ of the electrically conducting layer 40. This silicide layer provides for a low-ohmic contact between the electrically conducting layer 40 and the first and second semiconductor regions 31, 32. According to one example, the first sublayer $40_1$ is deposited at a temperature of about 600° C. At this temperature a silicidation process takes place during the deposition of the first sublayer $40_1$.

Referring to FIG. 11, the method may further include removing the electrically conducting layer 40 from the surface of the etch mask 400 and etching back the electrically conducting layer 40 in order to form a contact whole. According to one example, a bottom of this contact whole is within the etch mask 400. A contact plug can be formed in this contact hole in order to electrically contact the electrically conducting layer 41, 42 inside the respective trench 11, 12 and, therefore, the first or second doped region 31, 32.

Figure 12A:
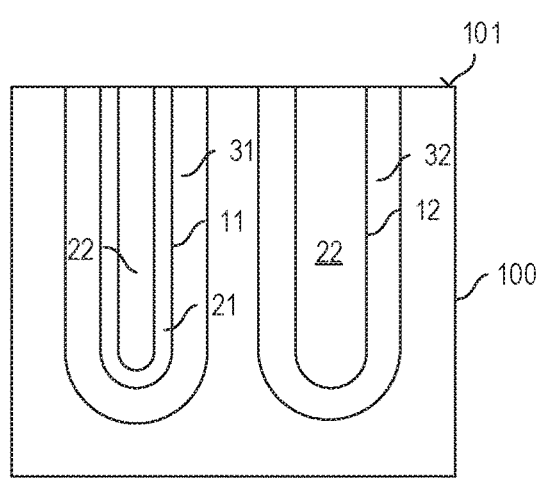
FIGS. 12A-12C show a modification of the method illustrated in FIGS. 10A-10D.
Figure 12B:
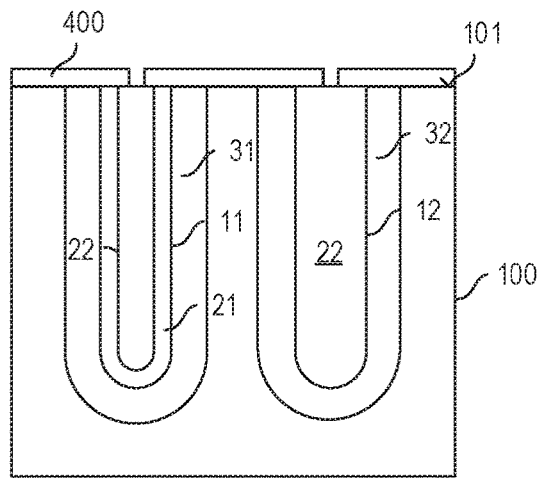
Figure 12C:
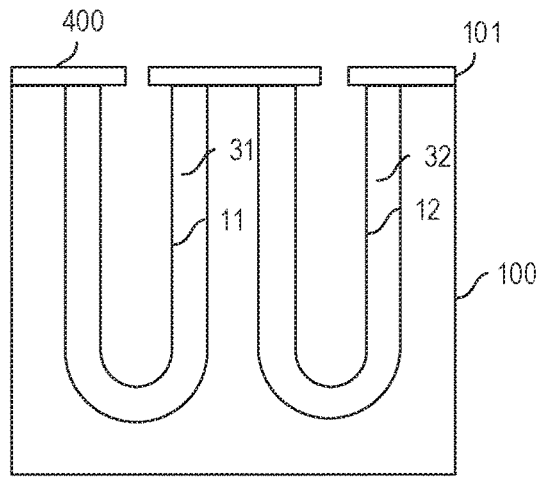

FIGS. 12A-12C illustrate a modification of the method illustrated in FIGS. 10A-10C. In this method, referring to FIG. 12A, the first and second layer 21, 22, in the vertical direction of the semiconductor body 100, extend to the first surface 101 of the semiconductor body so that there is no oxide plug 52. A topology of this type can be obtained, for example, by omitting the diffusion barrier 51 illustrated in FIGS. 9B and 9C or by forming the diffusion barrier 51 only in an opening of the first mask layer 210 and removing the diffusion barrier 51 together with the mask layer 210. The other method steps of the method shown in FIGS. 12A-12C are identical with those illustrated in FIGS. 10B-10C and include forming the patterned etch mask 400 with openings above the second layers 22 (see, FIG. 12B), removing the first and second layers 21, 22 in an etching process (see, FIG. 12C), and forming an electrically conducting layer (not shown in FIGS. 12A-12C) that at least covers surfaces of the semiconductor body 100 inside trenches resulting from removing the first and second layers 21, 22.

Figure 13A:
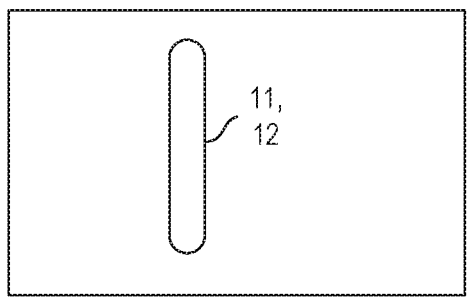
FIGS. 13A-13C show different examples of how the first and second trench may be implemented.
Figure 13B:
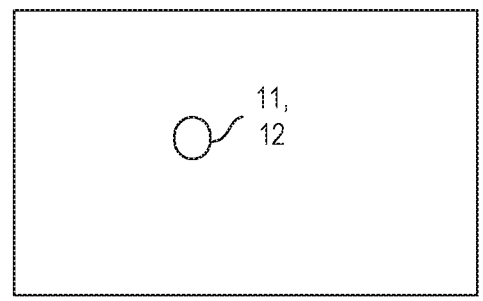
Figure 13C:
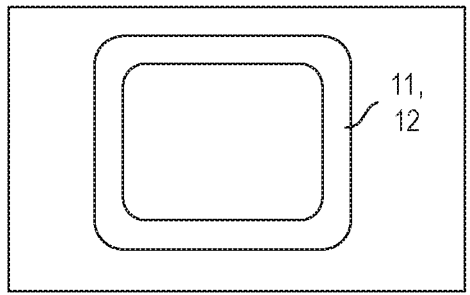

The drawings explained before show vertical cross-sectional views of the first and second trenches 11, 12 and of the semiconductor structures that are formed based on these first and second trenches 11, 12. In a horizontal plane of the semiconductor body 100, which is a plane parallel to the first surface 101, these trenches 11, 12 may have any of a plurality of different shapes. Three examples of how the first and second trenches 11, 12 may be implemented are schematically illustrated in FIGS. 13A-13C. Each of these Figures shows a horizontal cross-sectional view of one of the first and second trenches 11, 12. Referring to FIG. 13A, the trenches 11, 12 can be elongated trenches. Referring to FIG. 13B, the trenches 11, 12 can be needle-shaped trenches. According to another example shown in FIG. 13C the trenches can be ring-shaped trenches. Just for the purpose of illustration, the ring shown in FIG. 13C is a rectangular ring. However, any other type of ring geometry may be implemented as well.

The trench shapes illustrated in FIG. 13A-13C, and other trench shapes not illustrated, may be combined in any way. The first and second trenches 11, 12 may have the same shape or may have different shapes. Further, several first trenches 11 of the same shape or of different shapes can be produced in the semiconductor body 100, and several second trenches 12 of the same shape or of different shapes can be formed in a semiconductor body 100.

Figure 14A:
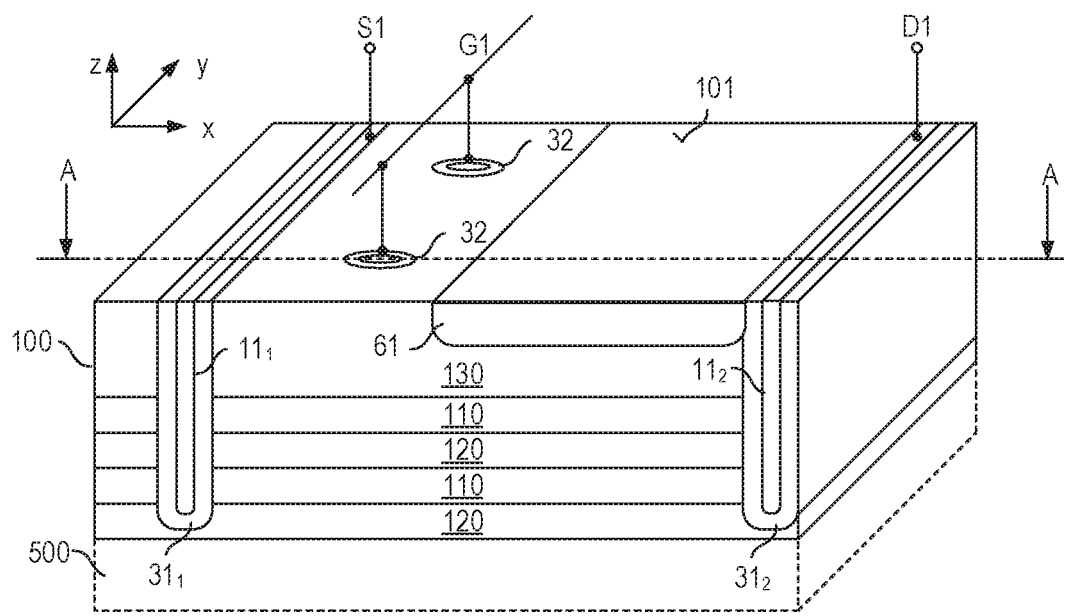
FIGS. 14A-14C illustrate one example of a semiconductor device that includes complementary doped semiconductor regions.
Figure 14B:
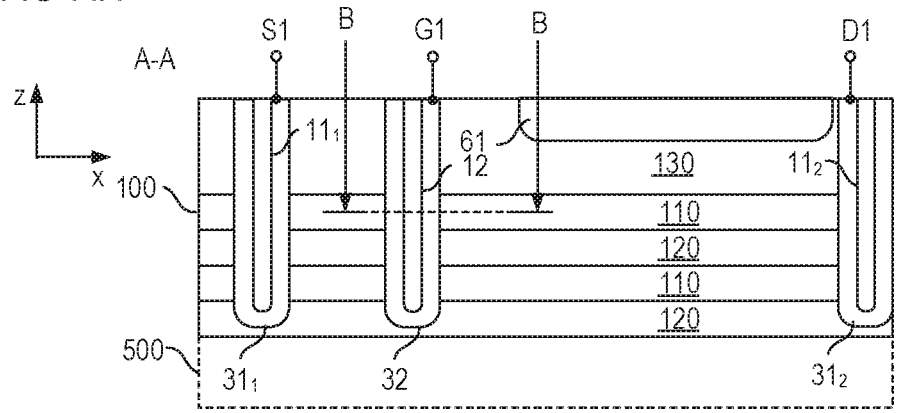
Figure 14C:
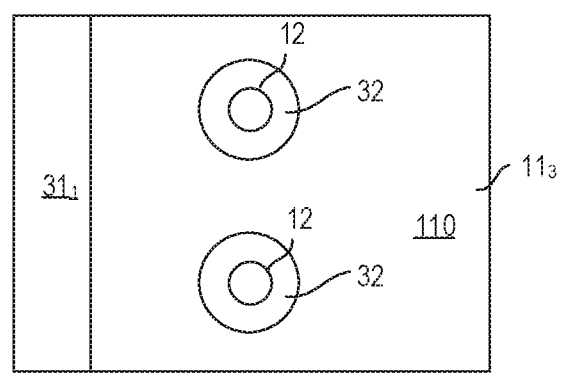

FIGS. 14A-14C show a perspective sectional view (FIG. 13A), a vertical cross-sectional view (FIG. 13B), and a horizontal cross-sectional view (FIG. 13C) of a semiconductor device that includes first and second semiconductor regions formed in accordance with the method explained herein before. The semiconductor device shown in FIGS. 14A-14C is a junction field-effect transistor (JFET) and includes two first semiconductor regions $31_1$, $31_2$ that are spaced apart from each other in a first lateral direction x of the semiconductor body 100. A first one $31_1$ of these semiconductor regions $31_1$, $31_2$ forms a source region of the transistor device and is electrically connected to a source node S1, which is only schematically illustrated in the drawings. A second one $31_2$ of these first semiconductor regions $31_1$, $31_2$ forms a drain region of the transistor device and is electrically connected to a drain node D1 of the transistor device. Further, the transistor device includes a plurality of second semiconductor regions 32. These second semiconductor region 32 are spaced apart from the source region $31_1$ in the first lateral direction x and are spaced apart from each other in a second lateral direction y, which may be perpendicular to the first lateral direction x. These second semiconductor region 32 form gate regions of the transistor device and are electrically connected to a gate node G1.

The transistor device illustrated in FIGS. 14A-14C is a superjunction transistor device. In this case, the semiconductor body 100 includes a plurality of first semiconductor layers 110 and a plurality of second semiconductor layers 120. These first and second layers 110, 120 are arranged on top of each other alternately in the vertical direction z of the semiconductor body 100. According to one example, the first layers 110 are doped semiconductor layers of the first doping type, which is the doping type of the first regions $31_1$, $31_2$, and the second layers 120 are doped semiconductor layers of the second doping type, which is the doping type of the second regions 32. Each of the first regions $31_1$, $31_2$ and the second regions 32 extend, in the vertical direction z, through the first and second semiconductor layers 110, 120 of the semiconductor body 100, so that each of the source region $32_1$, the drain region $31_2$ and the gate regions 32 adjoin these first and second layers 110, 120. A JFET of the type illustrated in FIG. 14A-14C is basically known, so that no further explanation with regard to the function of this transistor device are required.

Optionally, the semiconductor body 100 is arranged on a carrier 500. The carrier can be a semiconductor carrier, an electrically insulating carrier, or the like.

Referring to FIGS. 14A and 14B, the transistor device may include one or more shallow trench isolations (STIs) 61 in an uppermost semiconductor layer 130. The uppermost semiconductor layer 130 is the semiconductor layer that adjoins the first surface 101. According to one example, the semiconductor layer 130 has the second doping type and a lower doping concentration than the second layers 120.

In FIGS. 14A and 14B only one STI 61 is shown. This, however, is only an example. According to another example, two or more STIs may be arranged in a section of the uppermost semiconductor layer 130 between the gate regions 32 and drain region $31_2$. The STI 61 may be formed in the same process in which the oxide plugs 52 illustrated in FIGS. 10A-10D and 11 are formed (if such oxide plugs 52 are formed). It should be noted in this context that FIGS. 14A-14C only schematically illustrate the first and second doped regions $31_1$, $31_2$, 32 and first and second trenches $11_1$, $11_2$, 12 that were produced to form the first and second doped regions $31_1$, $31_2$, 32. These trenches may include the first and second layers 21, 22 or the second layer 22 used to form these doped regions $31_1$, $31_2$, 32 or conducting layers 41, 42 replacing the first and second layers 21, 22. Such first or second layers 21, 22 or conducting layers 41, 42 arranged in these trenches $11_1$, 11, 12, as well as optional oxide collars 52 are not shown in these figures. According to one example, the finished device includes at least one trench that includes both one first and one second layer 21, 22. Additionally, the finished device may include at least one second trench that includes one second layer 22 on the semiconductor body 100. Alternatively or additionally to such second trench with one second layer 22 the finished transistor device may include at least one third trench filled with a conducting material and adjoining a doped region of the first or second doping type. Such third trench may be formed based on one first trench or one second trench by replacing the first and second layers 21, 22 or the second layer 22 with a conducting material.

Figure 15:
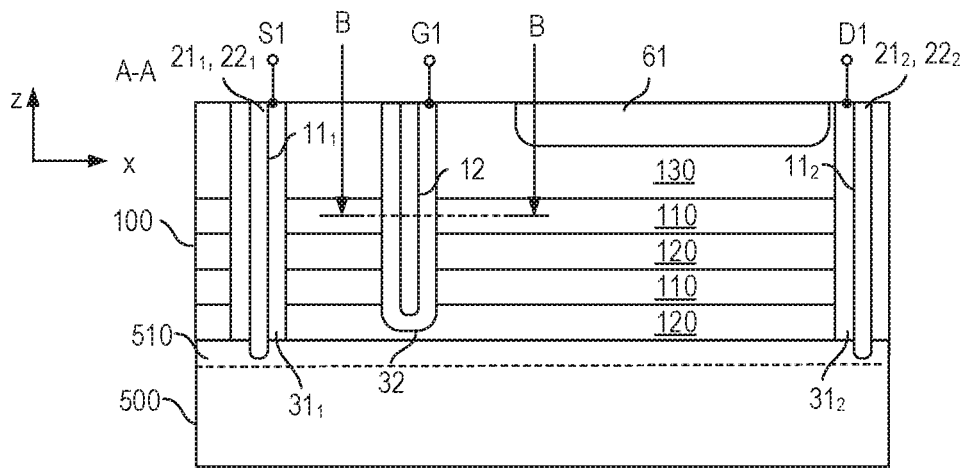
FIG. 15 illustrates a modification of the transistor device shown in FIGS. 14A-14B.

FIG. 15 shows a modification of the transistor device shown in FIGS. 14A and 14B, In this transistor device, the trenches $11_1$, $11_2$ formed to produce the first doped regions $31_1$, $31_2$ (which are the source and drain regions of the transistor device in this example) extend through the semiconductor body 100, that is, through the layer stack with the doped semiconductor layers 110, 120, 130 into the carrier 500. In this example, the carrier 500 is comprised of an electrically insulating material or, at least, includes an electrically insulating layer 510 adjoining the layer stack 110, 120, 130. Further first and second doped silicate glass layers $21_1$, $22_1$, $21_2$, $22_2$ formed in these trenches $11_1$, $11_2$ to produce the first doped regions $31_1$, $31_2$ remain in these trenches $11_1$, $11_2$. These glass layers $21_1$, $22_1$, $21_2$, $22_2$ extending into the carrier 500 and the carrier form a dielectric well that surrounds the active regions (source, drain and drift regions of the superjunction transistor device).

In FIG. 15, just for the purpose of illustration, it is assumed that the source and drain regions of the transistor device are regions of the first doping type so that the trenches $11_1$, $11_2$ formed to produce these regions include first and second doped silicate glass layers $21_1$, $22_1$, $21_2$, $22_2$ that correspond to the first and second layers explained with reference to FIGS. 1A-1E. According to another example, not shown, the source and drain regions are regions of the second doping type. In this case, trenches formed to produce these doped regions and extending into the carrier 500 only include second layers.

Further, in the example illustrated in FIG. 15, both the trench $11_1$ produced to form the source region $31_1$ and the trench $11_2$ produced to form the drain region $31_2$ extends into the carrier 500. This, however, is only an example. According to another example (not shown), only one of these trenches $11_1$, $11_2$ extends into the carrier 500. In the other trench, the respective first and/or second material layer can be replaced by an electrically conducting material.

Figure 16:
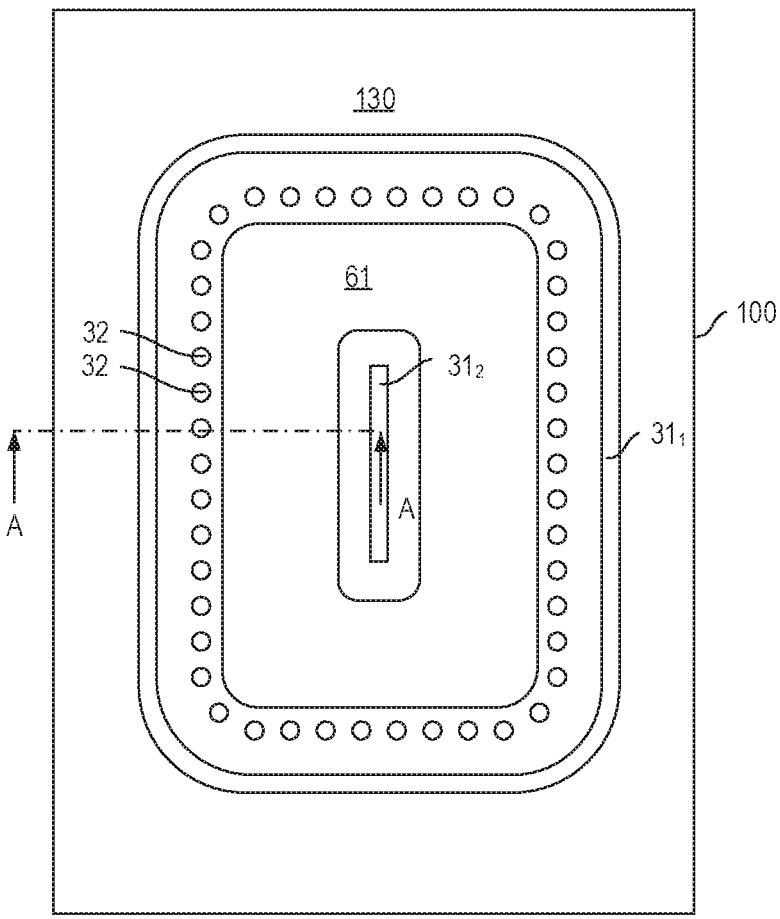
FIG. 16 shows a top view of the semiconductor device shown in FIGS. 13A-13C according to one example.

FIG. 16 shows a top view of a JFET of the type illustrated in FIGS. 13A-13C. In this example, the source region $31_1$ has a circular shape or an elliptical shape and surrounds the drain region $31_2$. The gate regions 32 are arranged between the source region $31_1$ and the drain region $31_2$ and are arranged along a circular curve. In this type of transistor device an electrically insulating well can be obtained by implementing the trench $11_1$ (not shown in FIG. 16) produced to form the source region $31_1$ such that it extends into an electrically insulating carrier 500 (not shown in FIG. 16) in the way explained with reference to FIG. 15. The trench $11_2$ (not shown in FIG. 16) produced to form the drain region $31_2$ is surrounded by the trench $11_1$ (not shown in FIG. 16) produced to form the source region $31_1$ and may extend into the carrier, but does not have to extend into the carrier to form an electrically insulating well.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming a first trench and a second trench in a semiconductor body;
   forming a first material layer on the semiconductor body in the first trench and the second trench such that a first residual trench remains in the first trench and a second residual trench remains in the second trench, the first material layer including dopants of a first doping type;
   removing the first material layer from the second trench;
   forming a second material layer on the first material layer in the first residual trench and on the semiconductor body in the second trench, the second material layer including dopants of a second doping type, complementary to the first doping type; and
   diffusing dopants from the first material layer in the first trench into the semiconductor body to form a first doped region, and from the second material layer in the second trench into the semiconductor body to form a second doped region.

2. The method of claim 1, wherein one of the first material layer and the second material layer comprises BSG.

3. The method of claim 2, wherein the other one of the first material layer and the second material layer comprises at least one of PSG and ASG.

4. The method of claim 1, further comprising:
   uncovering sections of a surface of the semiconductor body in the first trench; and
   forming an electrically conducting layer on the uncovered sections of the surface of the semiconductor body in the first trench.

5. The method of claim 4, wherein the uncovering the sections of the surface of the semiconductor body in the first trench comprises completely removing the first layer and the second layer from the first trench.

6. The method of claim 5, wherein completely removing the first layer and the second layer from the first trench comprises:
   forming an etch mask on top of the semiconductor body; and
   removing the first layer and the second layer using a wet etching process.

7. The method of claim 6, further comprising:
   forming an oxide collar in an upper section of the first trench before forming the etch mask.

8. The method of claim 4, wherein the electrically conducting layer comprises at least one of a metal and a doped polycrystalline semiconductor material.

9. The method of claim 1, further comprising:
   uncovering sections of a surface of the semiconductor body in the second trench; and
   forming an electrically conducting layer on the uncovered sections of the surface of the semiconductor body in the second trench.

10. The method of claim 9, wherein the uncovering the sections of the surface of the semiconductor body in the second trench comprises completely removing the second layer from the second trench.

11. The method of claim 10, wherein completely removing the second layer from the second trench comprises:
    forming an etch mask on top of the semiconductor body; and
    removing the second layer using a wet etching process.

12. The method of claim 11, further comprising:
    forming an oxide collar in an upper section of the second trench before forming the etch mask.

13. The method of claim 9, wherein the electrically conducting layer comprises at least one of a metal and a doped polycrystalline semiconductor material.

14. The method of claim 1, wherein forming the first trench comprises forming two or more first trenches and forming the first doped region comprises forming two or more first doped regions, and wherein forming the second trench comprises forming two or more second trenches and forming the second doped region comprises forming two or more second doped regions.

15. The method of claim 14, wherein a first one of the two or more first doped regions forms a source region of a transistor device, wherein a second one of the two or more first doped regions forms a drain region of the transistor device, and wherein the two or more second doped regions form gate regions of the transistor device.

16. The method of claim 14, wherein a first one of the two or more second doped regions forms a source region of a transistor device, wherein a second one of the two or more second doped regions forms a drain region of the transistor device, and wherein the two or more first doped regions form gate regions of the transistor device.

17. The method of claim 1, wherein the semiconductor body is arranged on a carrier and wherein at least one of the first trench and the second trench extends into the carrier.

18. The method of claim 17, wherein the carrier at least in sections adjoining the semiconductor body comprises an electrically insulating material.

\* \* \* \* \*